United States Patent [19]

McAdams

[11] Patent Number: 4,638,182
[45] Date of Patent: Jan. 20, 1987

[54] HIGH-LEVEL CMOS DRIVER CIRCUIT
[75] Inventor: Hugh P. McAdams, Houston, Tex.
[73] Assignee: Texas Instruments Incorporated, Dallas, Tex.
[21] Appl. No.: 630,470
[22] Filed: Jul. 11, 1984
[51] Int. Cl.[4] .................. H03K 17/10; H03K 17/687; H03K 19/094; H03K 3/027
[52] U.S. Cl. .................... 307/270; 307/578; 307/579; 307/585; 307/451; 365/226
[58] Field of Search ............ 307/270, 451, 576, 578, 307/579, 585, 255, 605, 482, 262; 365/226, 191

[56] References Cited

U.S. PATENT DOCUMENTS

| | | | |
|---|---|---|---|
| 3,774,055 | 11/1973 | Bapat | 307/453 |
| 4,121,203 | 10/1978 | Edwards et al. | 307/262 X |
| 4,239,993 | 12/1980 | McAlexander, III et al. | 307/279 X |
| 4,259,686 | 3/1981 | Suzuki et al. | 307/262 |
| 4,352,996 | 10/1982 | White, Jr. | 307/605 X |
| 4,384,216 | 5/1983 | Pricer | 307/270 |
| 4,499,387 | 2/1985 | Konishi | 307/585 X |
| 4,506,164 | 3/1985 | Higuchi | 307/270 X |
| 4,518,880 | 5/1985 | Masuda et al. | 307/579 X |

Primary Examiner—Stanley D. Miller
Assistant Examiner—David R. Bertelson
Attorney, Agent, or Firm—John G. Graham; Rodney M. Anderson

[57] ABSTRACT

A CMOS driver circuit for producing a high-level voltage, exceeding the voltage supply, uses an inverter and an output stage. The inverter circuit is supplied from the usual voltage supply for the chip, and this inverter is followed by the output stage which is supplied from an on-chip generator producing a higher level voltage. The current requirement of the on-chip generator is kept to a minimum by charging the output capacitance mainly from the voltage supply, and using the output stage only for the latter part of a charging cycle.

26 Claims, 4 Drawing Figures

HIGH-LEVEL CMOS DRIVER CIRCUIT

BACKGROUND OF THE INVENTION

This invention relates to semiconductor devices, and more particularly to driver circuits of the type used in CMOS VLSI semiconductor memory devices or the like.

Semiconductor memory devices of the dynamic read/write type are constructed in N-channel technology as shown in U.S. Pat. No. 4,239,993, issued to McAlexander, White and Rao, assigned to Texas Instruments. As set forth in such Patent, some of the clocks and control signals are preferably boosted to voltage levels above the supply. For example, the row lines are boosted so that a full one level can be written into the storage capacitors. Thus, the row decoder which activates the row lines must produce an output exceeding the power supply voltage. This is accomplished in NMOS circuitry by bootstrapping, but is not as easily achieved in CMOS technology.

Accordingly, one of the problems encountered in CMOS memory designs is that of getting the gate of N-channel transfer and load devices above the supply voltage Vcc in order to eliminate threshold losses on the signal level. Due to forward biasing the drain junction of the P-channel load device, the output of an inverter cannot be booted above Vcc as with NMOS drivers. One solution to this problem in CMOS is to provide a Vcc+ voltage, i.e., a voltage supply higher than the Vcc level supplied to the chip. Generated on chip from the Vcc supply, this voltage is sufficiently greater than Vcc that any NMOS device will be driven into the triode region, eliminating the Vt loss problem. The difficulty of this approach is generating sufficient current to handle the current requirements of any CMOS inverters connected to this Vcc+ supply. If the load to be driven has large capacitance and must be driven with fast transitions, this requires wide load transistors in the driver to meet the transition requirement. The Vcc+ thus has not only the capacitor charging current requirement but it must also be able to meet the large switching current in the inverter driver stage, when both the N and P channel devices are on.

It is therefore the principal object of this invention to provide improved driver circuits for semiconductor dynamic memory devices or the like, particularly using CMOS circuitry. Another object is to provide an improved driver circuit which produces an output exceeding the power supply voltage, but does not exhibit a high current drain upon an on-chip high voltage supply circuit.

SUMMARY OF THE INVENTION

In accordance with one embodiment of the invention, a CMOS driver circuit for producing a high-level output voltage, exceeding the voltage supply uses an inverter and an output stage. The inverter circuit is supplied from the usual voltage supply for the chip, and this inverter is followed by the output stage which is supplied from an on-chip generator producing a higher level voltage. The current requirement of the on-chip generator is kept to a minimum by charging the output capacitance mainly from the voltage supply, and using the output stage only for the latter part of a charging cycle.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, wherein:

DETAILED DESCRIPTION OF SPECIFIC EMBODIMENT

Figure 1:
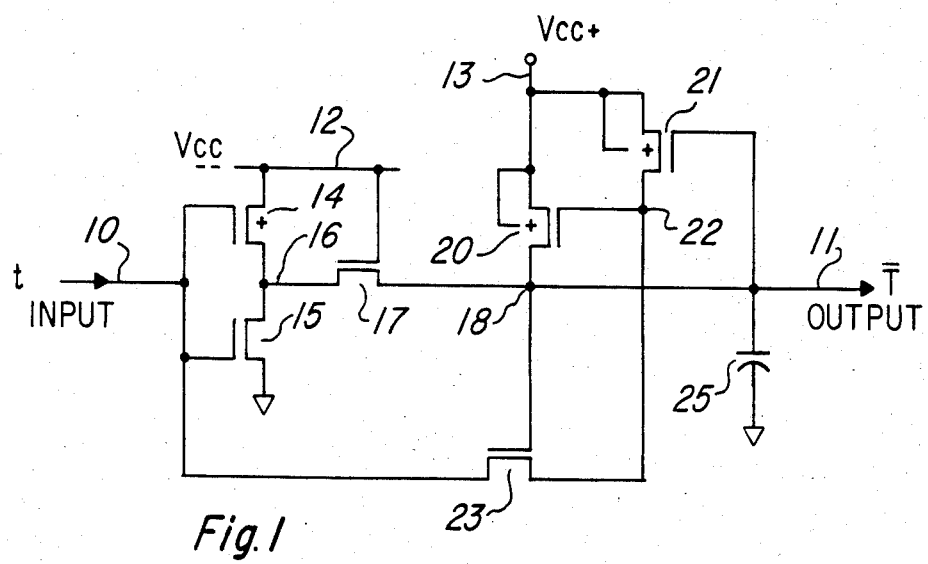
FIG. 1 is an electrical schematic diagram of a driver circuit according to the invention.

Referring to FIG. 1, a CMOS driver circuit according to the invention receives a low-level input "t" at an input node 10 and generates a high-level output "T̄" at an output terminal 11. This circuit uses the standard Vcc voltage on line 12 as supplied to the chip, usually +5v dc, and also uses a Vcc+ supply on line 13. The Vcc+ supply is at least one Vt above Vcc. A CMOS inverter including a P-channel transistor 14 and an N-channel transistor 15 receives the input 10 on the transistor gates, and the output 16 of this inverter is connected through an N-channel transfer device 17 to a node 18. The inverter is supplied from the Vcc voltage 12, and the gate of the transfer device 17 is connected to this supply. The output circuit for producing the high-level output T̄ employs P-channel transistors 20 and 21 each having its source connected to the Vcc+ supply 13. The transistor 20 couples the node 18 (which is the same as the output node 11) to Vcc+ when turned on by a zero voltage on its gate node 22; this gate node 22 is coupled to Vcc+ through the source-to-drain path of the other P-channel transistor 21, and coupled to the input node 10 via an N-channel transistor 23 which has its gate connected to the node 18. The transistor 21 has its gate connected to output terminal 11.

Figure 2:
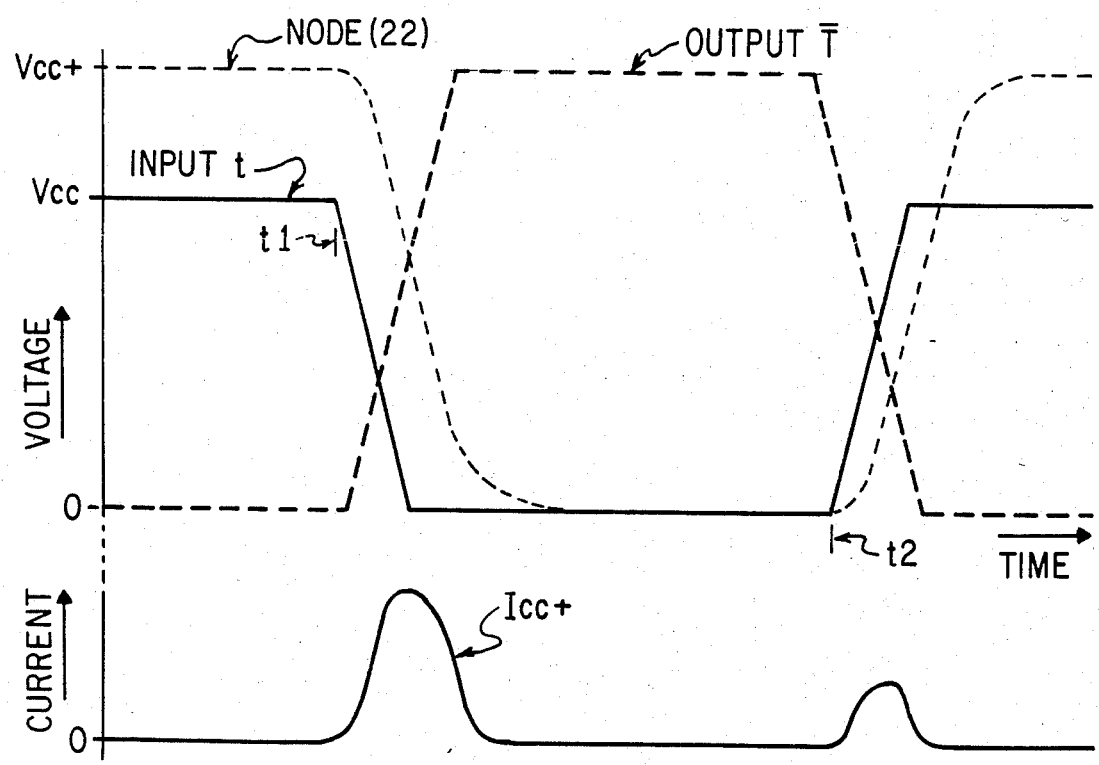
FIG. 2 is a timing diagram showing voltage for various nodes, and current from the high voltage supply, as a function for time, in the circuit of FIG. 1.

In the operation of the circuit of FIG. 1, first assume that the input t at node 10 is initially high, as seen in FIG. 2. This forces node 16 to be low, as well as node 18. The low voltage on node 18 causes node 22 to go to Vcc+, via device 21. Since node 18 is low, transistor 23 is off and this allows node 22 to reach Vcc+. With node 22 at Vcc+, transistor 20 is off and there is no continuous current flow from Vcc+. When input t at node 10 goes low at time t1 of FIG. 2, the node 16 goes high, to Vcc. Node 18 follows node 16 until device 17 begins to turn off due to insufficient gate-to-source voltage (between Vcc and node 18). Device 23 is designed such that node 22 is discharged and turns device 20 on about the time that device 17 is turning off. Device 20 continues charging the output nodes 18 and 11 to Vcc+. There is a short period of time while the output is reaching Vcc+ that devices 21 and 23 conduct charge from Vcc+, so there is current flow Icc+ as seen in FIG. 2. As node 18 reaches a voltage within a P-channel Vt of Vcc+, device 21 turns off. At this time only charge to the load capacitor 25 is pulled from Vcc+ as node 18 charges to a full Vcc+ level.

At time t2 the input 10 goes back up to Vcc, and this turns on the transistor 15 and turns off transistor 14. The capacitance 25 discharges rapidly through node 18 and transistor 17. There is some transitory current Icc+ through P-channel transistor 20, but very little because the node 22 follows the node 10 high, since transistor 23 is on.

The circuit of FIG. 1 is designed to reduce the current requirements on the Vcc+ supply 13 by reducing both the capacitor 25 charging current and inverter switching current supplied by Vcc+. Essentially all of the switching current requirement is removed by connecting the inverter 14,15 to Vcc line 12 rather than to Vcc+ line 13. Also a significant portion of the load capacitance charging current 25 when t goes low is initially supplied by the Vcc supply 12 through transistors 14 and 17. The Vcc+ supply is required only to charge the load capacitor 25 from approximately 80% of Vcc to the final Vcc+ level. The transfer device 17 prevents the drain of device 14 from forward biasing when node 18 goes to Vcc+, and devices 20, 21 and 23 control the charging of the load capacitance 25 from Vcc+ during the final part of the charging.

Figure 3:
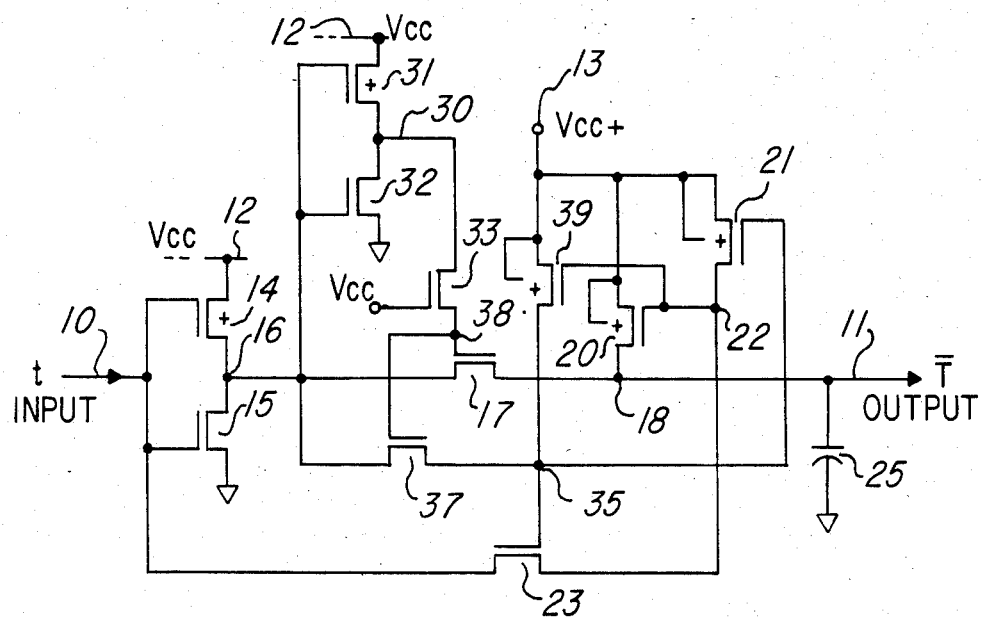
FIG. 3 is an electrical schematic diagram of a driver circuit according to another embodiment of the invention.

Another embodiment of the circuit of the invention is illustrated in FIG. 3. The inverter including the transistors 14 and 15 is the same, and the node 16 is coupled through a transistor 17 to the node 18 (and output 11) to charge the output capacitance 25. But the gate of the transistor 17 is driven from a node 30 at the output of a CMOS inverter having transistors 31 and 32, instead of directly from Vcc. This inverter has the voltage from node 16 connected to the gates of the inverter transistors 31 and 32, so the gate of the transistor 17 is charged to Vcc-Vt when the input 10 is high (node 16 is low), with a Vt drop across a transistor 33; when the input 10 is low (node 16 is high), the gate of transistor 17 is discharged through transistors 32 and 33. On the high voltage side of the circuit the capacitor 25 is charged from the Vcc+ line 13 by P-channel transistor 20 as before, and the gate of transistor 20 at node 22 is held low at the beginning of a cycle by a transistor 23 connecting this node 22 to the input 10, or held high by a P-channel transistor 21 at the final part of a cycle, similar to the circuit in FIG. 1. But in the embodiment of FIG. 3 the gate of transistor 21 is connected to a node 35 instead of to the output 11. The node 35 is coupled to the inverter output 16 by a transistor 37 having its gate connected to the node 38 at the gate of transistor 17. The node 35 is coupled to the high voltage Vcc+ line 13 by another P-channel transistor 39 which has its gate connected to the node 22. The gate of the transistor 23 is connected to the node 35 (instead of to the node 18).

The modified circuit of FIG. 3 gives some improvement in the reduction of charge required from Vcc+ (the current Icc+ of FIG. 4), at the expense of additional circuitry and thus additional area on the chip.

The basic operation remains the same but the reduction of charging current Icc+ from Vcc+ is due to (1) charging the load capacitor 25 to a full Vcc level from node 16 before charging to Vcc+ through device 20. This is accomplished through bootstrapping node 38 above Vcc and allowing node 18 to track node 16 all the way. The timing is designed such that nodes 38 and 30 turn device 17 off at the same time node 22 turns device 20 on.

(2) charging node 22 to a higher voltage before node 18 falls, thus reducing current through device 20 upon the falling edge of node 18.

(3) by connecting the gate of device 21 to node 35 instead of 18, current in device 21 is reduced; this reduction is the result of the fact that node 35 is less capacitively loaded than node 18 and thus is more quickly charged to Vcc+ than node 18 (and 11) when the input 10 goes low.

Figure 4:
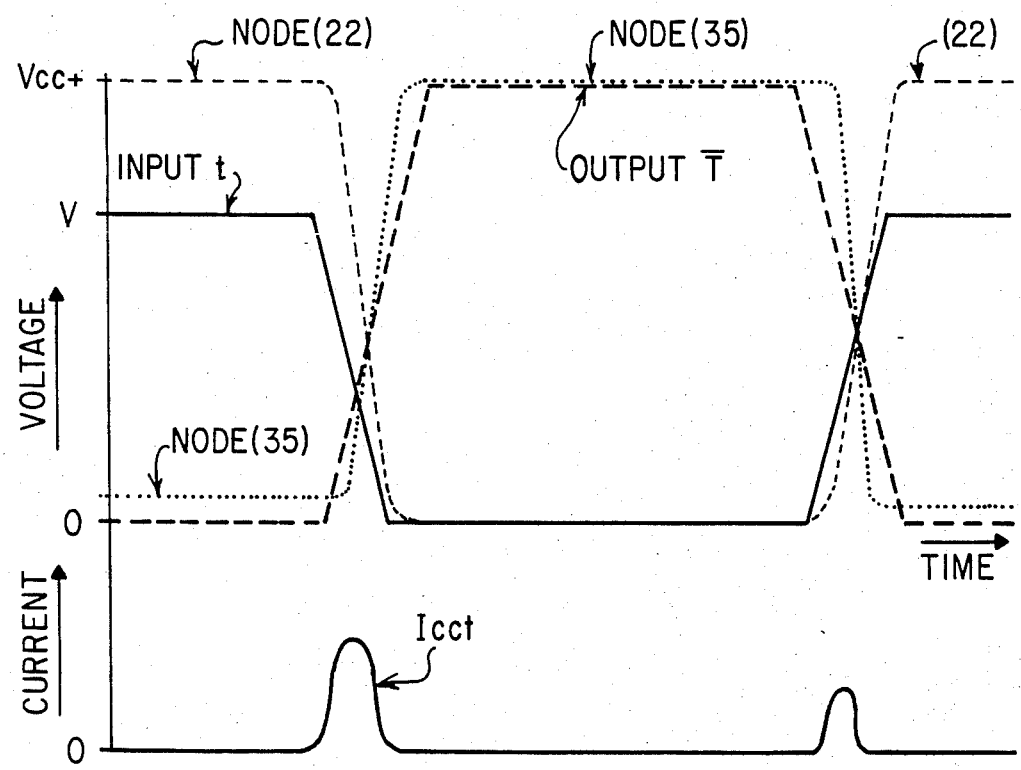
FIG. 4 is a timing diagram showing voltage for various nodes, and current from the high voltage supply, as a function of time, in the circuit of FIG. 3.

As seen in FIG. 4, the voltage waveform for node 22 has much sharper transitions than that of FIG. 2. Also, the node 35 makes the transition from one level to the other very rapidly, thus reducing the switching current.

While this invention has been described with reference an illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A driver circuit, comprising:
   an input node having a first logic state and a second logic state, said first and second logic states represented by different voltages,
   an output node having capacitance to be charged when said input node goes from said first logic state to said second logic state,
   charging means, connected to a first voltage supply and having an output, responsive to said input node so that said charging means connects said first voltage supply to said output of said charging means in response to said input node going from said first logic state to said second logic state,
   a series transistor having a source-to-drain path connected between said output of said charging means and said output node, and having a gate coupled to said first voltage supply so that said source-to-drain path of said series transistor connects said output of said charging means to said output node, thereby causing said capacitance to be charged by said first voltage supply in response to said input node going from said first logic state to said second logic state, and
   means, coupled to said input node, for connecting a second voltage supply of magnitude greater than said first voltage supply to said output node in response to said input node going from said first logic state to said second logic state.

2. A circuit according to claim 1 wherein said charging means comprises an inverter comprising a first transistor and a second transistor, said first and second transistors each having a source-to-drain path, such source-to-drain paths being connected in series between a first voltage supply and ground, said inverter having an output at the juncture of such source-to-drain paths, said first and second transistors having opposite channel conductivity-type, and said first and second transistors each having a gate connected to said input node so that said output of said inverter is connected to said first voltage supply in response to said input node going from said first logic state to said second logic state.

3. A circuit according to claim 2 wherein said means for connecting said second voltage supply to said output node comprises:
   a third transistor having a source-to-drain path connected between said second voltage supply and said output node, and having a gate, and a first biasing means, responsive to said input node and connected to said gate of said third transistor, for biasing the gate of said third transistor so that said second voltage supply is connected to said output node in response to said input node going from said first logic state to said second logic state.

4. A circuit according to claim 3 wherein said first biasing means comprises a fourth transistor having a source-to-drain path connected between the gate of said third transistor and said input node, and having a gate coupled to said output of said inverter so that, in response to said input node going from said first logic state to said second logic state, said gate of said third transistor is connected to said input node thereby connecting said second voltage supply to said output node.

5. A circuit according to claim 3 further comprising a second bisting means, responsive to said input node and connected to said gate of said third transistor, for biasing the gate of said third transistor so that said second voltage supply is disconnected from said output node in response to said input node returning from said second logic state to said first logic state.

6. A circuit according to claim 5 wherein said source-to-drain path of said third transistor is made non-conductive when said gate of said third transistor is connected to said second voltage supply, and wherein said second biasing means comprises a fifth transistor having a source-to-drain path connected between the gate of said third transistor and said second voltage supply, and having a gate coupled to said output of said inverter so that, in response to said input node returning from said second logic state to said first logic state, said second voltage supply is connected to said gate of said third transistor, thereby causing said second voltage supply to be disconnected from said output node.

7. A circuit according to claim 6 further comprising a third biasing means, responsive to said input node and connected to said gate of said fifth transistor, for biasing said gate of said fifth transistor so that said source-to-drain path of said fifth transistor is made non-conductive in response to said input node going from said first logic state to said second logic state.

8. A driver circuit, comprising:
an input node having a first logic state and a second logic state, said first and second logic states represented by different voltages,
an output node having capacitance to be charged when said input node goes from said first logic state to said second logic state,
charging means, connected to a first voltage supply and having an output, responsive to said input node so that said charging means connects said first voltage supply to said output of said charging means in response to said input node going from said first logic state to said second logic state,
a series transistor having a source-to-drain path connected between said output of said charging means and said output node, and having a gate,
means, coupled to said input node, for connecting a second voltage supply of magnitude greater than said first voltage supply to said output node in response to said input node going from said first logic state to said second logic state, and
means, responsive to said input node and connected to said gate of said series transistor, for biasing said gate of said series transistor so that said output of said charging means is connected to said output node for a predetermined period of time after said input node goes from said first logic state to said second logic state and is disconnected after said predetermined period of time.

9. A circuit according to claim 8 further comprising means, connected between said biasing means and said gate of said series transistor, for isolating said gate of said series transistor from said biasing means so that the voltage at the gate of said series transistor reaches a voltage greater than the voltage of said first voltage supply during such time as said output of said charging means is connected to said output node, thereby allowing said first voltage supply to charge said capacitance until said voltage on said capacitance reaches a voltage greater than the voltage of said first voltage supply less one transistor threshold voltage drop.

10. A circuit to claim 8 wherein said charging means comprises a first inverter comprising a first transistor and a second transistor, said first and second transistors each having a source-to-drain path, such source-to-drain paths being connected in series between a first voltage supply and ground, said first inverter having an output at the juncture of said source-to-drain paths, said first and second transistors having opposite channel conductivity-type, and said first and second transistors each having a gate connected to said input node so that said output of said first inverter is connected to said first voltage supply in response to said input node going from said first logic state to said second logic state.

11. A circuit according to claim 10 wherein said biasing means comprises:
a second inverter having a third transistor and a fourth transistor, said third and fourth transistors each having a source-to-drain path, such source-to-drain paths being connected in series between said first voltage supply and ground, said third and fourth transistors having opposite channel conductivity-type, said third and fourth transistors each having a gate, such gates connected to each other and coupled to said output of said charging means, and said second inverter having an output at the juncture of said source-to-drain paths, said output coupled to said gate of said series transistor so that, in response to said input node going from said first logic state to said second logic state, said gate of said series transistor is biased so that said output node is disconnected from said output of said first inverter after such time as said first voltage supply has charged said capacitance.

12. A circuit according to claim 11 further comprising a fifth transistor having a source-to-drain path connected between said gate of said series transistor and said output of said second inverter, and having a gate connected to said first voltage supply so that said gate of said series transistor reaches a voltage greater than the level of the first voltage supply during such time as said output of said first inverter is connected to said output node, thereby allowing said first voltage supply to charge said capacitance to a voltage greater than the level of said first voltage supply less one transistor threshold voltage drop.

13. A CMOS driver circuit, comprising:
an input node receiving a low-level signal,
an output node having significant capacitance to be charged when said low-level signal switches,
a CMOS inverter with a P-channel transistor and an N-channel transistor, said transistors having source-to-drain paths connected in series between a first voltage supply and ground, and an output at the juncture of such source-to-drain paths, the gates of said transistors being connected to said input node.

an output stage having first and second P-channel transistors, each having a source-to-drain path and a gate, and second voltage supply, the source-to-drain path of the first transistor connecting said second voltage supply to said output node, the gate of said first transistor being connected to a control node, the source-to-drain path of said second transistor connecting said second voltage supply to said control node, the gate of said second transistor being connected to said output node, a series transistor having a source-to-drain path and a gate, the source-to-drain path of said series transistor being connected between said output of the inverter and said output node, the gate of said series transistor being coupled to said first voltage supply, and a control transistor having source-to-drain path and a gate, the source-to-drain path of said control transistor connecting said control node to said input node, the gate of said control transistor being coupled to said output node.

14. A circuit according to claim 13 wherein said control transistor and said series transistor are both N-channel MOS transistors.

15. A circuit according to claim 13 wherein said second voltage supply is at least about one Vt above the voltage of the first voltage supply.

16. A circuit according to claim 15 wherein said driver circuit is constructed on a semiconductor integrated circuit chip.

17. A circuit according to claim 16 wherein said first voltage supply is connected to said chip from external to the chip, and said second voltage supply is generated on said chip from said first voltage supply.

18. A circuit according to claim 17 wherein said capacitance is charged from said first voltage supply for an initial period after said input signal goes from a high level to a low level, and then is charged from said second voltage supply for a final period until said output node reaches a voltage above the level of said first voltage supply.

19. A driver circuit, comprising:
an input node which has one and another logic states represented by substantially different voltages,
an output node having substantial capacitance to be charged when said input node goes from said one to said another logic state,
an inverter with a first transistor and a second transistor, said transistors having source-to-drain paths connected in series between a first voltage supply and ground, said first and second transistors having opposite channel conductivity-type, and an output at the juncture of such source-to-drain paths, the gates of said transistors being connected to said input node,
a series transistor having a source-to-drain path and a gate, the source-to-drain path of said series transistor being connected between said output of the inverter and said output node, and the gate of said series transistor coupled to said first voltage supply in such a manner as to charge said capacitance from said first voltage supply when said input node goes from said one to said another logic state,
and high voltage charging means connecting said output node to a second voltage supply of magnitude higher than said first voltage supply, said charging means having a first input coupled to said output node and a second input coupled to said input node.

20. A circuit according to claim 19 wherein said charging means includes third and fourth transistors, each having a source-to-drain path and a gate, the source-to-drain path of the third transistor connecting said second voltage supply to said output node, the source-to-drain path of said fourth transistor connecting said second voltage supply to the gate of said third transistor, said gate of the third transistor being coupled to said input node by a coupling means, and said gate of the fourth transistor being coupled to said output node.

21. A circuit according to claim 20 wherein said coupling means is controlled by said output node.

22. A circuit according to claim 21 wherein said coupling means is a fifth transistor having its gate coupled to said output node and having a source-to-drain path connected between said gate of the third transistor and said input node.

23. A circuit according to claim 19 wherein said gate of said series transistor is coupled to said voltage supply.

24. A circuit according to claim 19 wherein said first transistor is P-channel, and said second transistor and said series transistor are N-channel.

25. A circuit according to claim 23 wherein said third and fourth transistors are of the same type as said first transistor.

26. A circuit according to claim 25 wherein said first, third and fourth transistors are P-channel and said second, series, and fifth transistors are N-channel.

* * * * *